US012476088B2

(12) United States Patent
Ito

(10) Patent No.: US 12,476,088 B2
(45) Date of Patent: Nov. 18, 2025

(54) PLASMA PROCESSING APPARATUS AND INNER CHAMBER

(71) Applicant: Tokyo Electron Limited, Tokyo (JP)

(72) Inventor: Koei Ito, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 130 days.

(21) Appl. No.: 17/970,607

(22) Filed: Oct. 21, 2022

(65) Prior Publication Data

US 2023/0131199 A1 Apr. 27, 2023

(30) Foreign Application Priority Data

Oct. 27, 2021 (JP) ................................. 2021-175381

(51) Int. Cl.
*H01J 37/32* (2006.01)

(52) U.S. Cl.
CPC .. *H01J 37/32568* (2013.01); *H01J 37/32458* (2013.01); *H01J 37/32834* (2013.01)

(58) Field of Classification Search
CPC ............. H01J 37/32091; H01J 37/3244; H01J 37/32449; H01J 37/32458; H01J 37/32568; H01J 37/32834
See application file for complete search history.

(56) References Cited

U.S. PATENT DOCUMENTS

| | | | | |
|---|---|---|---|---|
| 6,733,620 B1 * | 5/2004 | Sugiyama ......... | H01J 37/32834 | 118/715 |
| 2003/0092278 A1 * | 5/2003 | Fink .................. | H01J 37/32633 | 438/709 |
| 2011/0049100 A1 * | 3/2011 | Han .................. | H01L 21/68728 | 156/345.43 |
| 2012/0070963 A1 * | 3/2012 | Martin .............. | H01J 37/32633 | 118/723 R |
| 2014/0332498 A1 * | 11/2014 | Han .................. | H01J 37/32715 | 156/345.43 |
| 2020/0267826 A1 * | 8/2020 | Kawada ................... | H05H 1/46 | |

FOREIGN PATENT DOCUMENTS

| | | | | | |
|---|---|---|---|---|---|
| CN | 105040097 B | * | 5/2018 | | |
| JP | 11-317397 A | | 11/1999 | | |
| JP | 2004-200460 A | | 7/2004 | | |
| KR | 20080073912 A | * | 8/2008 | ........ | H01J 37/32633 |

* cited by examiner

*Primary Examiner* — Raymond R Chai
(74) *Attorney, Agent, or Firm* — XSENSUS LLP

(57) ABSTRACT

A plasma processing apparatus includes a substrate support, an upper electrode, an inner chamber, and an exhaust device in an outer chamber. The substrate support is provided in the outer chamber. The upper electrode is provided above the substrate support. The inner chamber defines a substrate processing space on the substrate support. The exhaust device is connected to an exhaust port provided at a bottom portion of the outer chamber. The inner chamber includes a ceiling portion and a sidewall portion. The ceiling portion extends on the substrate processing space, provides a plurality of gas holes, and configures a shower head together with the upper electrode. The sidewall portion extends in a peripheral direction to surround the substrate processing space and provides a plurality of through-holes. The sidewall portion has an opening area that increases along a direction from a lower end toward an upper end of the sidewall portion.

15 Claims, 4 Drawing Sheets

PLASMA PROCESSING APPARATUS AND INNER CHAMBER

CROSS-REFERENCE TO RELATED APPLICATION

This application claims priority to Japanese Patent Application No. 2021-175381, filed on Oct. 27, 2021, the entire contents of which are incorporated herein by reference.

TECHNICAL FIELD

Exemplary embodiments of the present disclosure relate to a plasma processing apparatus and an inner chamber.

BACKGROUND

As a type of a plasma processing apparatus, a capacitively-coupled plasma processing apparatus is used. The capacitively-coupled plasma processing apparatuses described in Patent Documents 1 and 2 have a chamber, a substrate support, an upper electrode, and a baffle plate. The substrate support includes a lower electrode and is provided in the chamber. The substrate support supports a substrate placed on an upper surface of the substrate support. The upper electrode is provided on the substrate support and configures a shower head. The baffle plate is provided to surround the substrate support below the upper surface of the substrate support. The baffle plate provides a plurality of through-holes. An exhaust port is provided below the baffle plate in a bottom portion of the chamber, and an exhaust device is connected to the exhaust port. The baffle plate is formed such that an opening area widens from an inner peripheral portion thereof toward an outer peripheral portion thereof.

PRIOR ART DOCUMENTS

Patent Documents

[Patent Document 1]
Japanese Patent Application Publication No. 2004-200460
[Patent Document 2]
Japanese Patent Application Publication No. 11-317397

SUMMARY

Technical Problems

The present disclosure, among other improvements and advantages, provides a technique of reducing a variation in a flow velocity of a gas in a radial direction in a substrate processing space.

Solution to Problem

In an exemplary embodiment, a plasma processing apparatus is provided. The plasma processing apparatus includes an outer chamber, a substrate support, an upper electrode, an inner chamber, and an exhaust device. The outer chamber provides an exhaust port in a bottom portion of the outer chamber. The substrate support includes a lower electrode and is provided in the outer chamber. The upper electrode is provided above the substrate support. The inner chamber defines, together with the substrate support, a substrate processing space on the substrate support in the outer chamber. The exhaust device is connected to a space provided in the outer chamber and outside the inner chamber via an exhaust port of the outer chamber. The inner chamber is detachable from the upper electrode. The inner chamber includes a ceiling portion and a sidewall portion. The ceiling portion extends on the substrate processing space and provides a plurality of gas holes. The ceiling portion constitutes a shower head together with the upper electrode. The sidewall portion extends in a peripheral direction to surround the substrate processing space. The sidewall portion provides a plurality of through-holes. The sidewall portion has an opening area that gradually or continuously increases along a direction from a lower end toward an upper end of the sidewall portion.

Advantageous Effects

According to an exemplary embodiment, it is possible, among other improvements and advantages, to reduce the variation in the flow velocity of the gas in the radial direction in the substrate processing space.

DETAILED DESCRIPTION

Figure 1:
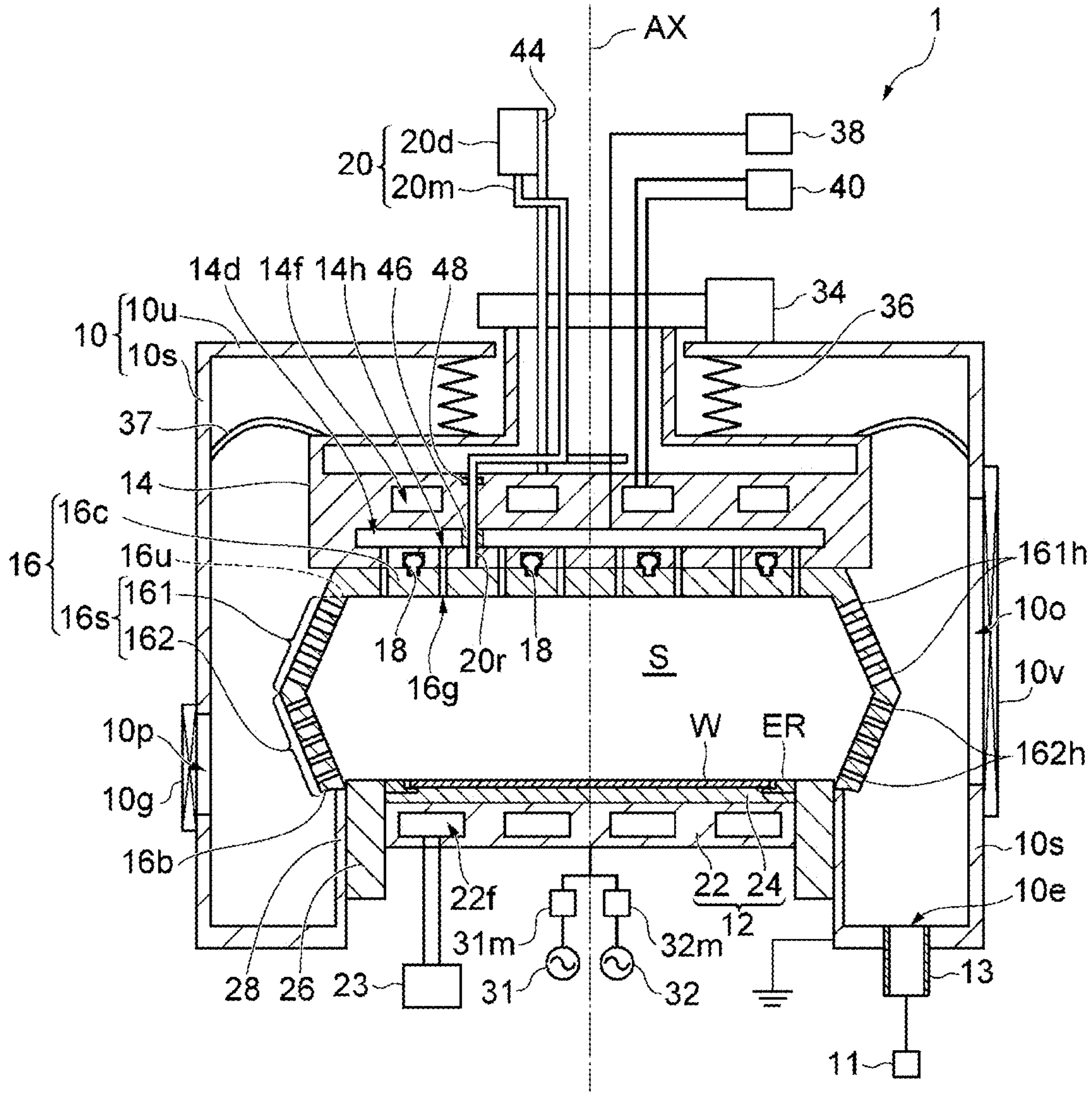
FIG. 1 is a diagram schematically showing a plasma processing apparatus according to an exemplary embodiment.

Hereinafter, various exemplary embodiments will be described.

In an exemplary embodiment, a plasma processing apparatus is provided. The plasma processing apparatus includes an outer chamber, a substrate support, an upper electrode, an inner chamber, and an exhaust device. The outer chamber provides an exhaust port in a bottom portion of the outer chamber. The substrate support includes a lower electrode and is provided in the outer chamber. The upper electrode is provided above the substrate support. The inner chamber, together with the substrate support, includes a substrate processing space on the substrate support in the outer chamber. The exhaust device is connected to a space provided in the outer chamber and outside the inner chamber via an exhaust port of the outer chamber. The inner chamber is detachable from the upper electrode. The inner chamber includes a ceiling portion and a sidewall portion. The ceiling portion extends on the substrate processing space and provides a plurality of gas holes. The ceiling portion configures a shower head (gas shower head) together with the upper electrode. The sidewall portion extends in a peripheral direction to surround the substrate processing space. The sidewall portion provides a plurality of through-holes. The sidewall portion has an opening area that gradually or continuously increases along a direction from a lower end toward an upper end of the sidewall portion.

In another exemplary embodiment, an inner chamber used in an outer chamber of a plasma processing apparatus is provided. The inner chamber includes a ceiling portion and a sidewall portion. The ceiling portion extends on the substrate processing space and provides a plurality of gas holes. The sidewall portion extends in a peripheral direction on a side of the substrate processing space to surround the substrate processing space. The sidewall portion provides a plurality of through-holes and has an opening area that gradually or continuously increases along a direction from a lower end toward an upper end of the sidewall portion.

According to the embodiment, a gas pressure variation is reduced in a radial direction in the substrate processing space. Therefore, a flow velocity variation of the gas is reduced in the radial direction in the substrate processing space.

In an exemplary embodiment, the sidewall portion may include an upper portion and a lower portion. An opening area of the upper portion may be larger than an opening area of the lower portion.

In an exemplary embodiment, the upper portion may be a portion from a center between the upper end and the lower end to the upper end in the sidewall portion. That is, the upper portion may be an upper half portion of the sidewall portion. The lower portion may be a portion from the center to the lower end in the sidewall portion. That is, the lower portion may be a lower half portion of the sidewall portion.

In an exemplary embodiment, the plurality of through-holes may have a circular or oval shape.

In an exemplary embodiment, a maximum width (diameter or width of long axis) of each of a plurality of first through-holes provided in the upper portion among the plurality of through-holes is larger than a maximum width (diameter or width of long axis) of each of a plurality of second through-holes provided in the lower portion among the plurality of through-holes.

In an exemplary embodiment, a density of the plurality of through-holes in the upper portion may be higher than a density of the plurality of through-holes in the lower portion.

In an exemplary embodiment, each of the plurality of through-holes may have a maximum width (diameter or width of long axis) of each through-hole that is larger than a maximum width (diameter or width of long axis) of any other through-hole provided closer to the lower end with respect to the plurality of through-holes.

In an exemplary embodiment, a density of the plurality of through-holes may increase along a direction from the lower end toward the upper end.

In an exemplary embodiment, the sidewall portion may have a shape that expands between the upper end and the lower end. Alternatively, the sidewall portion may have a cylindrical shape.

Hereinafter, various exemplary embodiments will be described in detail with reference to the drawings. Further, like reference numerals will be given to like or corresponding parts throughout the drawings.

FIG. 1 is a diagram schematically showing a plasma processing apparatus according to an exemplary embodiment. A plasma processing apparatus 1 shown in FIG. 1 is a capacitively coupled plasma processing apparatus. The plasma processing apparatus 1 includes an outer chamber 10, a substrate support 12, an upper electrode 14, an inner chamber 16, and an exhaust device 11.

The outer chamber 10 has an interior space therein. The outer chamber 10 is made of a metal such as aluminum. The outer chamber 10 is electrically grounded. A corrosion-resistant film may be formed on a surface of the outer chamber 10. The corrosion-resistant film is made of a material such as aluminum oxide or yttrium oxide.

The outer chamber 10 includes a sidewall 10*s*. The sidewall 10*s* has a substantially cylindrical shape. A central axis of the sidewall 10*s* extends in a vertical direction and is indicated by an axis AX in FIG. 1. The sidewall 10*s* provides a passage 10*p*. The passage 10*p* can be opened and closed by a gate valve 10*g*. The substrate W passes through the passage 10*p* when the substrate W is transferred between the interior space of the outer chamber 10 and the outside of the outer chamber 10 by a transfer device.

The sidewall 10*s* further provides an opening 10*o*. The opening 10*o* has a size that allows the inner chamber 16 to pass therethrough. The opening 10*o* can be opened and closed by agate valve 10*v*. The inner chamber 16 passes through the opening 10*o* when the inner chamber 16 is transferred between the interior space of the outer chamber 10 and the outside of the outer chamber 10 by the transfer device.

The outer chamber 10 may further include an upper portion 10*u*. The upper portion 10*u* extends in a direction intersecting the axis AX from an upper end of the sidewall 10*s*. The upper portion 10*u* provides an opening in a region intersecting the axis AX.

The outer chamber 10 provides an exhaust port 10*e* in a bottom portion thereof. An exhaust pipe 13 is attached to the bottom portion of the outer chamber 10 and connected to the exhaust port 10*e*. The exhaust device 11 is connected to a space (exhaust space) provided inside the outer chamber 10 and outside the inner chamber 16 via the exhaust pipe 13 and the exhaust port 10*e*. The exhaust device 11 includes a pressure regulator, such as an automatic pressure control valve, and a depressurization pump, such as a turbo molecular pump.

The substrate support 12 is provided in the outer chamber 10. The substrate support 12 is configured to support a substrate W placed thereon. The substrate support 12 provides a lower electrode. The substrate support 12 may include a base 22 and an electrostatic chuck 24. The base 22 has a substantially disk shape. A central axis of the base 22 substantially coincides with the axis AX. The base 22 is made of a conductor such as aluminum. The base 22 may be configured to function as the lower electrode. The base 22 provides a flow path 22*f* therein. The flow path 22*f* extends, e.g., in a spiral shape. The flow path 22*f* is connected to a chiller unit 23. The chiller unit 23 is provided outside the outer chamber 10. The chiller unit 23 supplies a heat medium (for example, coolant) to the flow path 22*f*. The heat medium supplied to the flow path 22*f* flows through the flow path 22*f* and is returned to the chiller unit 23.

The electrostatic chuck 24 is located on the base 22. The electrostatic chuck 24 includes a main body and an electrode chuck. The main body of the electrostatic chuck 24 has a substantially disc shape. A central axis of the electrostatic chuck 24 substantially coincides with the axis AX. The main body of the electrostatic chuck 24 is made of ceramic. The substrate W is placed on an upper surface of the main body of the electrostatic chuck 24. The chuck electrode is a film made of a conductor. The chuck electrode is provided in the main body of the electrostatic chuck 24. The chuck electrode is connected to a direct-current power supply via a switch. When a voltage from the direct-current power supply is applied to the chuck electrode, an electrostatic attraction force is generated between the electrostatic chuck 24 and the substrate W. The substrate W is attracted to and held by the electrostatic chuck 24 by the generated electrostatic attractive force. The plasma processing apparatus 1 may provide a gas line for supplying a heat transfer gas (for example, helium gas) to a gap between the electrostatic chuck 24 and a rear surface of the substrate W.

The substrate support 12 may further support an edge ring ER disposed thereon. The substrate W is placed on the electrostatic chuck 24 in a region surrounded by the edge ring ER. The edge ring ER is made of, e.g., silicon, quartz, or silicon carbide.

The plasma processing apparatus 1 may further include an insulating portion 26. The insulating portion 26 is made of an insulator such as quartz. The insulating portion 26 may have a substantially tubular shape. The insulating portion 26 extends along an outer periphery of the base 22 and an outer periphery of the electrostatic chuck 24.

The plasma processing apparatus 1 may further include a conductor portion 28. The conductor portion 28 is made of a conductor such as aluminum. The conductor portion 28 may have a substantially tubular shape. The conductor portion 28 extends along an outer peripheral surface of the insulating portion 26. The conductor portion 28 extends in a peripheral direction outside the insulating portion 26 in a radial direction. The radial direction and the peripheral direction are directions with the axis AX as a reference. The conductor portion 28 is connected to the ground. In an example, the conductor portion 28 is connected to the ground via the outer chamber 10. The conductor portion 28 may be a part of the outer chamber 10.

The plasma processing apparatus 1 may further include a radio-frequency power supply 31 and a bias power supply 32. The radio-frequency power supply 31 is a power supply that generates source radio-frequency power. The source radio-frequency power has a frequency suitable for generating plasma. A frequency of the source radio-frequency power is, for example, 27 MHz or higher. The radio-frequency power supply 31 is electrically connected to the lower electrode in the substrate support 12 via a matcher 31*m*. The radio-frequency power supply 31 may be electrically connected to the base 22. The matcher 31*m* has a matching circuit for matching an impedance on a load side of the radio-frequency power supply 31 with an output impedance of the radio-frequency power supply 31. The radio-frequency power supply 31 may be electrically connected to another electrode in the substrate support 12. Alternatively, the radio-frequency power supply 31 may be connected to the upper electrode via the matcher 31*m*.

The bias power supply 32 is a power supply that generates electric bias energy. The electric bias energy is supplied to the lower electrode of the substrate support 12 to draw an ion from the plasma toward the substrate W. The electric bias energy may be bias radio-frequency power. A waveform of the bias radio-frequency power is a sine wave having the bias frequency. The bias frequency is, for example, 13.56 MHz or less. In this case, the bias power supply 32 is electrically connected to the lower electrode of the substrate support 12 via a matcher 32*m*. The bias power supply 32 may be electrically connected to the base 22. The matcher 32*m* has a matching circuit for matching an impedance of a load side of the bias power supply 32 with an output impedance of the bias power supply 32. The bias power supply 32 may be electrically connected to another electrode in the substrate support 12.

Alternatively, the electric bias energy may be a pulse of a voltage periodically generated at time intervals that are reciprocals of the bias frequency described above. The pulse of the voltage may have a negative polarity. The pulse of the voltage may be a pulse generated from a negative direct-current voltage.

The upper electrode 14 is provided above the substrate support 12. The upper electrode 14 is provided below the upper portion 10*u* of the outer chamber 10 and inside the sidewall 10*s*. The upper electrode 14 is configured to be movable upward and downward in the outer chamber 10.

The plasma processing apparatus 1 may further include a lift mechanism 34. The lift mechanism 34 is configured to move the upper electrode 14 upward and downward. The lift mechanism 34 includes a drive device (for example, motor) that generates power for moving the upper electrode 14. The lift mechanism 34 may be provided outside the outer chamber 10 and on or above the upper portion 10*u*.

The plasma processing apparatus 1 may further include a bellows 36. The bellows 36 is provided between the upper electrode 14 and the upper portion 10*u*. The bellows 36 separates the interior space of the outer chamber 10 from the outside of the outer chamber 10. A lower end of the bellows 36 is fixed to the upper electrode 14. An upper end of the bellows 36 is fixed to the upper portion 10*u*.

The upper electrode 14 has a substantially disc shape. A central axis of the upper electrode 14 is the axis AX. The upper electrode 14 is made of a conductor such as aluminum. In an embodiment, the upper electrode 14 may be grounded when the radio-frequency power supply 31 is electrically connected to the lower electrode in the substrate support 12. In this case, the upper electrode 14 may be in contact with an inner wall surface of the outer chamber 10 via a connection member 37.

The upper electrode 14 configures a shower head together with a ceiling portion described below of the inner chamber 16. The shower head is configured to supply a gas into a substrate processing space S described below. Therefore, the upper electrode 14 provides a gas diffusion chamber 14*d* and a plurality of gas holes 14*h*.

The gas diffusion chamber 14*d* is provided in the upper electrode 14. A gas supply 38 is connected to the gas diffusion chamber 14*d*. The gas supply 38 is provided outside the outer chamber 10. The gas supply 38 includes one or more gas sources used in the plasma processing apparatus 1, one or more flow rate controllers, and one or more valves. Each of one or more gas sources is connected to the gas diffusion chamber 14*d* via a corresponding flow rate controller and a corresponding valve. The plurality of gas holes 14*h* extend downward from the gas diffusion chamber 14*d*.

In an embodiment, the upper electrode 14 may provide a flow path 14*f* therein. The flow path 14*f* is connected to a chiller unit 40. The chiller unit 40 is provided outside the outer chamber 10. The chiller unit 40 supplies a heat medium (for example, coolant) to the flow path 14*f*. The heat medium supplied to the flow path 14*f* flows through the flow path 14*f* and is returned to the chiller unit 40.

The inner chamber 16 defines the substrate processing space S on the substrate support 12 in the outer chamber 10, together with the substrate support 12. The inner chamber 16 may be made of a metal such as aluminum. A corrosion-resistant film may be formed on a surface of the inner chamber 16. The corrosion-resistant film is made of a material such as aluminum oxide or yttrium oxide.

The inner chamber 16 is detachable from the upper electrode 14. The inner chamber 16 or a ceiling portion 16*c* thereof is detachably fixed to the upper electrode 14 by one or more contact members 18. The inner chamber 16 is configured to be transferable between the inside and the outside of the outer chamber 10.

The plasma processing apparatus 1 may further include an actuator 20 to release the fixing of the inner chamber 16 to the upper electrode 14. The actuator 20 is configured to move the inner chamber 16 downward. In an embodiment, the actuator 20 includes a drive device 20*d*. The actuator 20 may include a plurality of rods 20*r*.

The drive device 20*d* is provided outside the outer chamber 10. The drive device 20*d* generates power for moving a drive shaft 20*m* thereof up and down. The drive device 20*d* may include a power cylinder such as an air cylinder or a motor. The drive device 20*d* is fixed to the upper electrode 14 in the outside of the outer chamber 10.

The plurality of rods 20*r* are connected to the drive shaft 20*m*. The plurality of rods 20*r* extend downward from the drive shaft 20*m*. The plurality of rods 20*r* are disposed along the peripheral direction around the axis AX. The plurality of rods 20*r* may be disposed at equal intervals.

The upper electrode 14 provides a plurality of through-holes extending in the vertical direction. The plurality of through-holes penetrate the upper electrode 14 from an upper surface of the upper electrode 14 to a lower surface of the upper electrode 14 through the gas diffusion chamber 14*d*. The plurality of rods 20*r* are inserted into the plurality of through-holes of the upper electrode 14. A sealing member 48 such as an O-ring is provided between the upper electrode 14 and each of the plurality of rods 20*r*. The plurality of rods 20*r* penetrate through an inner hole of a tubular member 46 in the gas diffusion chamber 14*d*.

The plurality of rods 20*r* are moved up and down by the drive device 20*d*. The plurality of rods 20*r* are disposed such that lower ends of the rods 20*r* are located at the same horizontal level as or above an upper surface of the ceiling portion 16*c* of the inner chamber 16 in a state where the inner chamber 16 is fixed to the upper electrode 14. When the inner chamber 16 is removed from the upper electrode 14, the plurality of rods 20*r* are moved by the drive device 20*d* such that the inner chamber 16 is moved downward in a state where the lower ends of the rods 20*r* are in contact with the upper surface of the ceiling portion 16*c* of the inner chamber 16.

The inner chamber 16 includes a ceiling portion 16*c* and a sidewall portion 16*s*. The ceiling portion 16*c* can be disposed above the substrate support 12 and below the upper electrode 14. The ceiling portion 16*c* has a plate shape and a substantially disc shape. The ceiling portion 16*c* is disposed such that a central axis thereof is located on the axis AX in the outer chamber 10. The ceiling portion 16*c* may be disposed immediately below the upper electrode 14 in the outer chamber 10. Alternatively, a heat transfer sheet may be sandwiched between the lower surface of the upper electrode 14 and the inner chamber 16.

As described above, the ceiling portion 16*c* configures the shower head together with the upper electrode 14. The ceiling portion 16*c* provides a plurality of gas holes 16*g*. The plurality of gas holes 16*g* penetrate the ceiling portion 16*c*. The ceiling portion 16*c* is disposed in the outer chamber 10 such that the plurality of gas holes 16*g* respectively communicate with the plurality of gas holes 14*h*. A gas from the gas supply 38 described above is supplied to the substrate processing space S via the gas diffusion chamber 14*d*, the plurality of gas holes 14*h*, and the plurality of gas holes 16*g*.

The sidewall portion 16*s* extends in the peripheral direction to surround the substrate processing space S. The sidewall portion 16*s* extends downward from a peripheral portion of the ceiling portion 16*c*. The sidewall portion 16*s* is disposed such that a central axis thereof is located on the axis AX in the outer chamber 10. A lower end 16*b* of the sidewall portion 16*s* may be configured to be in contact with the conductor portion 28.

In an embodiment, the sidewall portion 16*s* may have a shape that radially expands between an upper end 16*u* and lower end 16*b* thereof. In this case, a distance between the plasma generated in the substrate processing space S and the sidewall portion 16*s* is more uniformized. In another embodiment, the sidewall portion 16*s* may have a cylindrical shape.

Hereinafter, FIGS. 2A, 2B, 2C, 3A, 3B, and 3C will be referred to, together with FIG. 1. FIGS. 2A, 2B, 2C, 3A, 3B, and 3C each are an exemplary plan view of an upper portion and lower portion of the inner chamber.

The sidewall portion 16*s* provides a plurality of through-holes 16*h*. The plurality of through-holes 16*h* communicate the substrate processing space S and the space (exhaust space) outside the sidewall portion 16*s* with each other. The gas in the substrate processing space S is exhausted by the exhaust device 11 via the plurality of through-holes 16*h* and the space (exhaust space) outside the sidewall portion 16*s*. The plurality of through-holes 16*h* are uniformly distributed in the peripheral direction so as to bring uniform exhaust. An opening area of the sidewall portion 16*s* effected by the plurality of through-holes 16*h* gradually or continuously increases along a direction from the lower end 16*b* toward the upper end 16*u*.

In an embodiment, the sidewall portion 16*s* includes an upper portion 161 and a lower portion 162. The upper portion 161 includes the upper end 16*u* and extends on the lower portion 162. The upper portion 161 may be a portion from a center between the upper end 16*u* and the lower end 16*b* to the upper end 16*u* in the sidewall portion 16*s*. That is, the upper portion 161 may be an upper half portion of the sidewall portion 16*s*. The lower portion 162 includes the lower end 16*b* and extends below the upper portion 161. The lower portion 162 may be a portion from the center between the upper end 16*u* and the lower end 16*b* to the lower end 16*b* in the sidewall portion 16*s*. That is, the lower portion 162 may be a lower half portion of the sidewall portion 16*s*. In an embodiment, an opening area of the upper portion 161 may be larger than an opening area of the lower portion 162.

In an embodiment, the plurality of through-holes 16*h* may include a plurality of first through-holes 161*h* formed in the upper portion 161. Further, the plurality of through-holes 16*h* may include a plurality of second through-holes 162*h* formed in the lower portion 162.

Figure 2A:
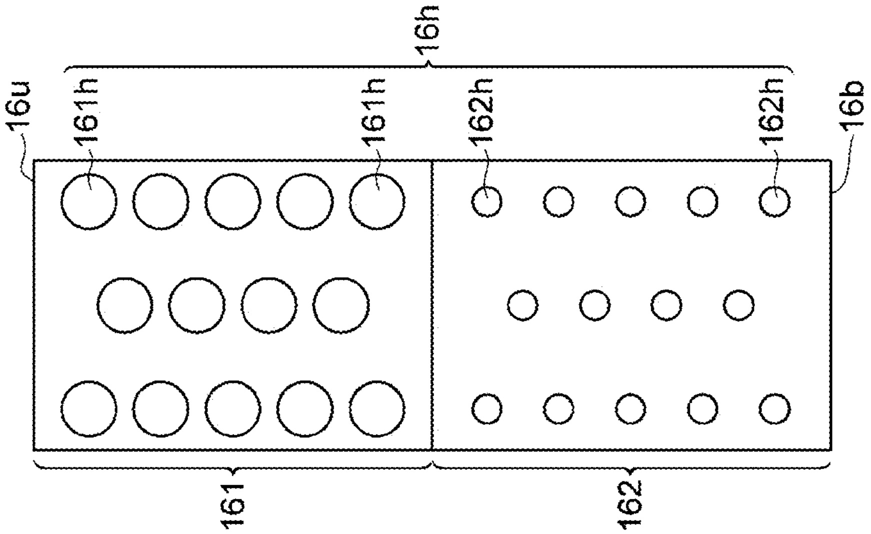
FIGS. 2A, 2B, and 2C are exemplary plan views of upper and lower portions of an inner chamber.

In an embodiment, the plurality of through-holes 16*h* may have a circular shape, as shown in FIG. 2A. In this case, a diameter of each of the plurality of first through-holes 161*h* may be larger than a diameter of each of the plurality of second through-holes 162*h*.

Figure 2B:
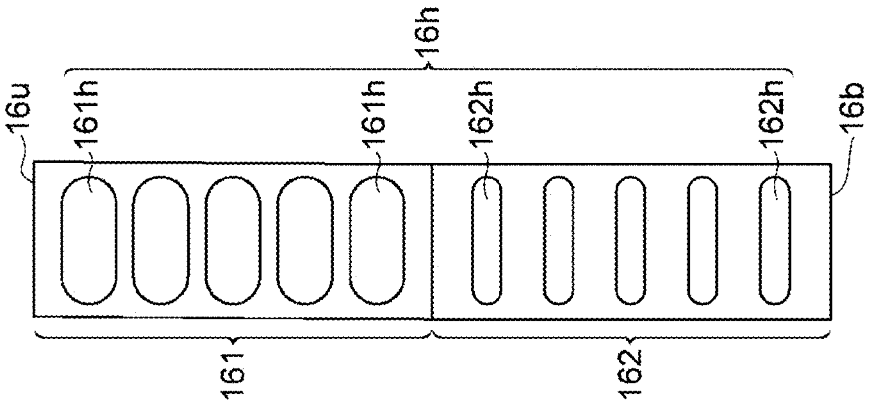

In an embodiment, the plurality of through-holes 16*h* may have an oval shape, as shown in FIG. 2B. A long axis of each of the plurality of through-holes 16*h* may extend in a direction orthogonal to the vertical direction and the radial direction. In this case, a maximum width (width of long axis) of each of the plurality of first through-holes 161*h* may be larger than a maximum width (width of long axis) of each of the plurality of second through-holes 162*h*.

Figure 2C:
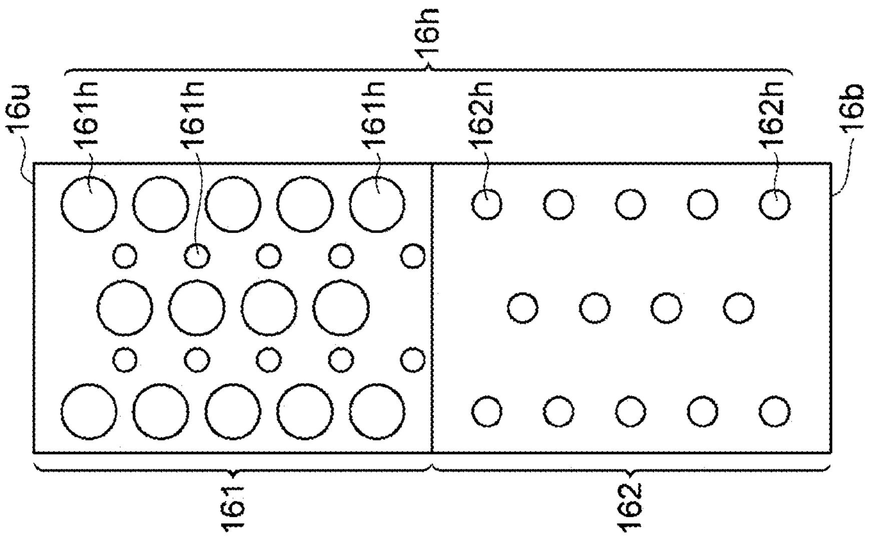

In an embodiment, a density of the plurality of first through-holes 161*h* in the upper portion 161 may be higher than a density of the plurality of second through-holes 162*h* in the lower portion 162, as shown in FIG. 2C. In this case, the plurality of first through-holes 161*h* and the plurality of second through-holes 162*h* may have a circular shape or an oval shape. A maximum width (diameter or width of long axis) of each of the plurality of first through-holes 161*h* may be the same as or different from a maximum width (diameter or width of long axis) of each of the plurality of second through-holes 162*h*. The maximum width (diameter or width of long axis) of each of the plurality of first through-holes 161*h* may be larger than the maximum width (diameter or width of long axis) of each of the plurality of second through-holes 162*h*. Further, the upper portion 161 may provide the plurality of first through-holes 161*h* having a different maximum width. Although not illustrated, the density of the plurality of through-holes 16*h* may continuously increase along the direction from the lower end 16*b* toward the upper end 16*u*.

Figure 3C:
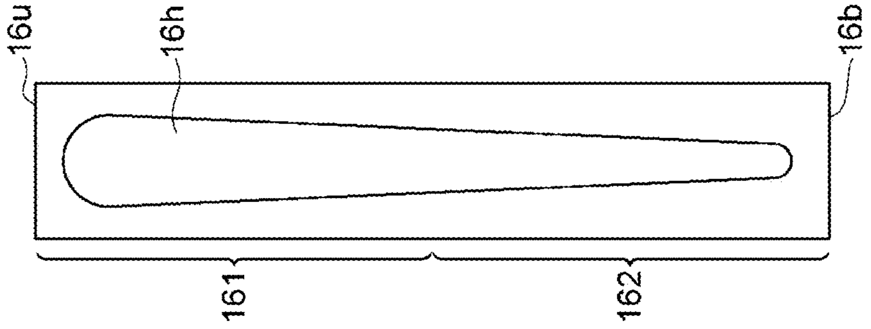
FIGS. 3A, 3B, and 3C are exemplary plan views of upper and lower portions of an inner chamber.
Figure 3B:
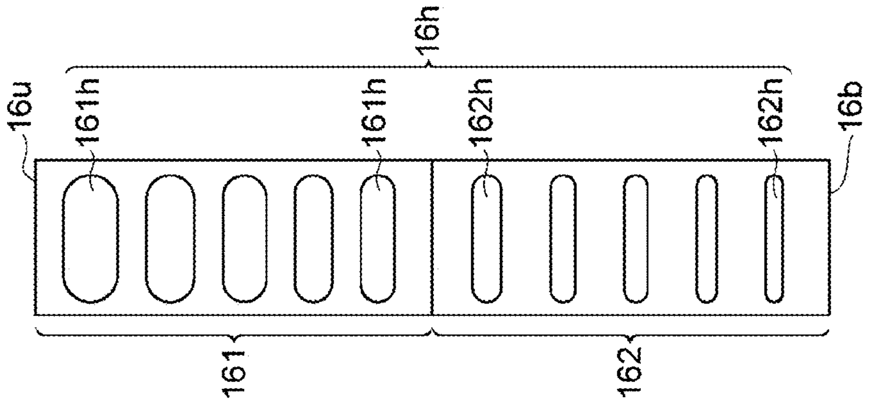
Figure 3A:
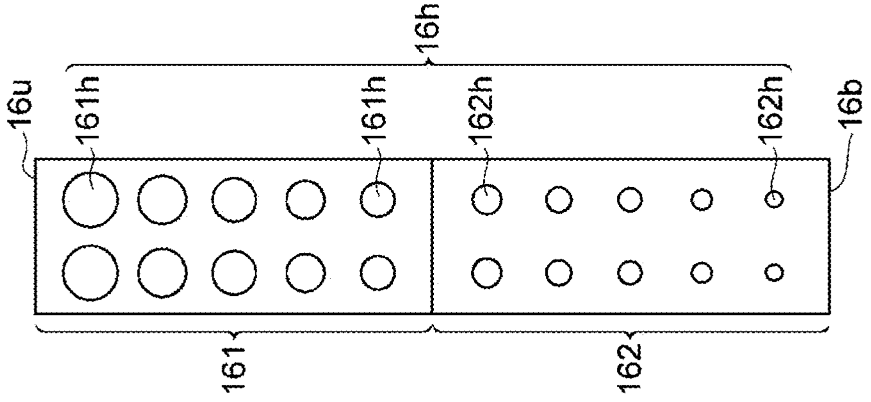

In an embodiment, the plurality of through-holes 16*h* may have a circular shape, as shown in FIG. 3A. Further, in an embodiment, the plurality of through-holes 16*h* may have an oval shape, as illustrated in FIG. 3B. As shown in FIGS. 3A and 3B, each of the plurality of through-holes 16*h* may have a maximum width (diameter or width of long axis) larger than a maximum width (diameter or width of long axis) of a through-hole 16*h* provided closer to the lower end 16*b* with respect to the plurality of through-holes 16*h*. That is, the maximum width (diameter or width of long axis) of the plurality of through-holes 16*h* may continuously increase along the direction from the lower end 16*b* toward the upper end 16*u*.

In an embodiment, each of the plurality of through-holes 16*h* may extend in the direction from the lower end 16*b* toward the upper end 16*u*, as shown in FIG. 3C. In this case, the width of each of the plurality of through-holes 16*h* continuously increases along the direction from the lower end 16*b* toward the upper end 16*u*.

With the plasma processing apparatus 1 and the inner chamber 16 described above, a gas pressure variation is reduced in the radial direction in the substrate processing space S is reduced. Therefore, a flow velocity variation of the gas is reduced in the radial direction in the substrate processing space S is reduced.

Hereinafter, a first simulation #1 and a second simulation #2 performed for evaluating the plasma processing apparatus 1 will be described. In the first simulation #1, the sidewall portion 16*s* had the plurality of through-holes 16*h* shown in FIG. 2A. In the first simulation #1, the upper portion 161 was the upper half of the sidewall portion 16*s*, and the lower portion 162 was the lower half of the sidewall portion 16*s*. In the first simulation #1, the diameter of the plurality of first through-holes 161*h* were 4 mm, and the diameter of the plurality of second through-holes 162*h* were 3 mm. A condition of the second simulation #2 was different from a condition of the first simulation #1 only in that the diameter of the plurality of first through-holes 161*h* and the diameter of the plurality of second through-holes 162*h* were both 3 mm. In the first simulation #1 and the second simulation #2, a standard deviation of the pressure of the gas and a standard deviation of the flow velocity of the gas in the substrate processing space S were obtained.

Figure 4A:
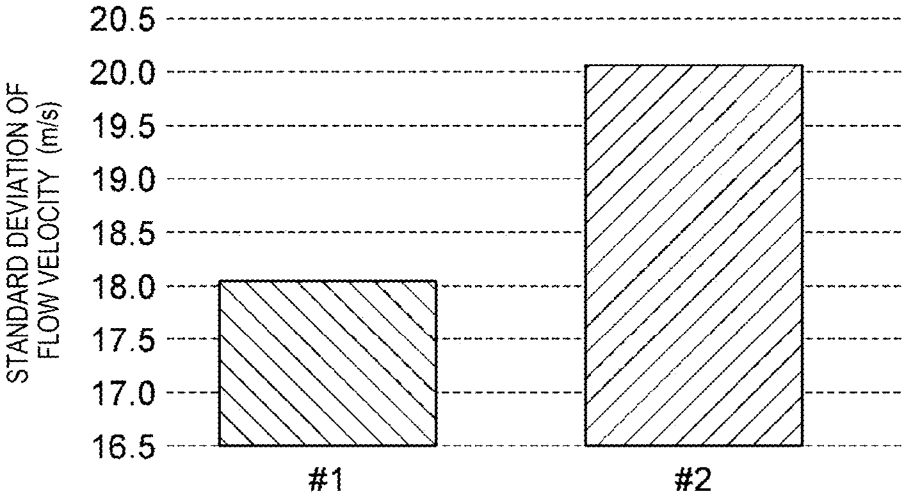
FIGS. 4A and 4B are diagrams showing result of a first simulation and a second simulation.
Figure 4B:
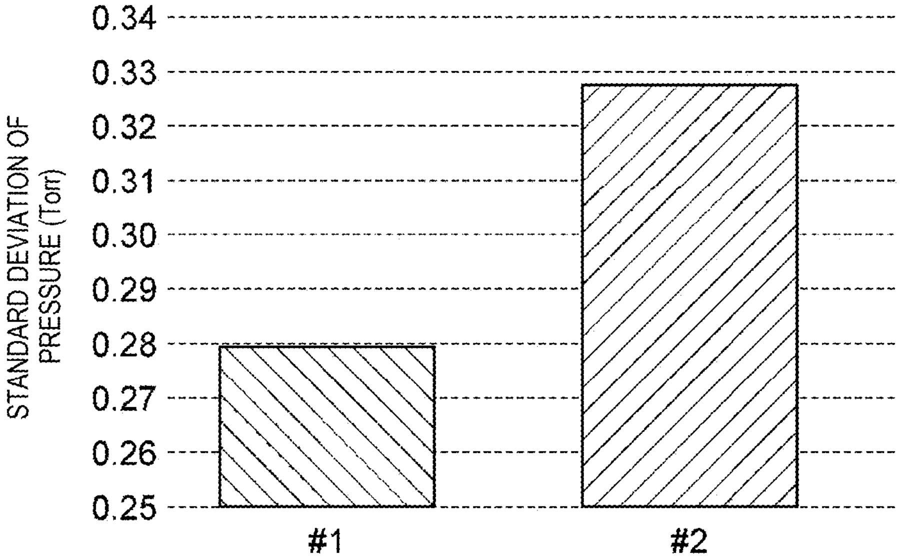

FIGS. 4A and 4B each are a diagram showing results of the first simulation and the second simulation. As shown in FIGS. 4A and 4B, in the first simulation #1, the standard deviation of the pressure of the gas and the standard deviation of the flow velocity of the gas in the substrate processing space S were smaller than those in the second simulation #2. Therefore, it was confirmed that the gas flow velocity variation was reduced in the radial direction in the substrate processing space S with the plasma processing apparatus 1.

While various exemplary embodiments have been described above, various additions, omissions, substitutions and changes may be made without being limited to the exemplary embodiments described above. Indeed, the embodiments described herein may be embodied in a variety of other forms.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A plasma processing apparatus comprising:
an outer chamber;
a substrate support including a lower electrode and provided in the outer chamber;
an upper electrode provided above the substrate support;
an inner chamber that defines, together with the substrate support, a substrate processing space on the substrate support in the outer chamber; and
an exhaust device connected to a space provided in the outer chamber and outside the inner chamber via an exhaust port provided at a bottom portion of the outer chamber,
wherein the inner chamber is detachable from the upper electrode, and includes:
a ceiling portion extending on the substrate processing space, providing a plurality of gas holes, and configuring a shower head together with the upper electrode; and
a sidewall portion extending in a peripheral direction to surround the substrate processing space,
wherein the sidewall portion provides a plurality of through-holes that each has an opening area that increases continuously or increases intermittently with plateaus along a direction from a lower end of the sidewall portion toward an upper end thereof,
wherein the opening area of the through-holes is in general alignment along the direction from a lower end of the sidewall portion toward an upper end thereof,
wherein the plurality of through-holes includes a plurality of first through-holes provided in the upper portion and a plurality of second through holes provided in the lower portion, and
wherein a maximum width of each of the plurality of first through-holes is larger than a maximum width of each of the plurality of second through-holes.

2. The plasma processing apparatus according to claim 1, wherein the sidewall portion includes an upper portion and a lower portion, and
wherein an opening area of the upper portion is larger than an opening area of the lower portion.

3. The plasma processing apparatus according to claim 2, wherein the upper portion is a portion from a center between the upper end and the lower end to the upper end in the sidewall portion, and
wherein the lower portion is a portion from the center to the lower end in the sidewall portion.

4. The plasma processing apparatus according to claim 2, wherein the plurality of through-holes have a circular or oval shape.

5. The plasma processing apparatus according to claim 4, wherein a density of the plurality of through-holes in the upper portion is higher than a density of the plurality of through-holes in the lower portion.

6. The plasma processing apparatus according to claim 1, wherein the sidewall portion has a shape that expands between the upper end and the lower end.

7. A plasma processing apparatus comprising:
an outer chamber;
a substrate support including a lower electrode and provided in the outer chamber;
an upper electrode provided above the substrate support;

an inner chamber that defines, together with the substrate support, a substrate processing space on the substrate support in the outer chamber; and an exhaust device connected to a space provided in the outer chamber and outside the inner chamber via an exhaust port provided at a bottom portion of the outer chamber, wherein the inner chamber is detachable from the upper electrode, and includes:

a ceiling portion extending on the substrate processing space, providing a plurality of gas holes, and configuring a shower head together with the upper electrode; and a sidewall portion extending in a peripheral direction to surround the substrate processing space, wherein the sidewall portion provides a plurality of through-holes that each has an opening area that increases continuously or increases intermittently with plateaus along a direction from a lower end of the sidewall portion toward an upper end thereof, wherein the opening area of the through-holes is in general alignment along the direction from a lower end of the sidewall portion toward an upper end thereof, and wherein each of the plurality of through-holes provided closer to the upper end has a maximum width that is larger than a maximum width of any through-hole provided closer to the lower end.

8. The plasma processing apparatus according to claim 7, wherein the plurality of through-holes have a circular or oval shape.

9. The plasma processing apparatus according to claim 8, wherein a density of the plurality of through-holes increases along a direction from the lower end toward the upper end.

10. A plasma processing apparatus comprising:

an outer chamber;

a substrate support including a lower electrode and provided in the outer chamber;

an upper electrode provided above the substrate support;

an inner chamber that defines, together with the substrate support, a substrate processing space on the substrate support in the outer chamber; and an exhaust device connected to a space provided in the outer chamber and outside the inner chamber via an exhaust port provided at a bottom portion of the outer chamber, wherein the inner chamber is detachable from the upper electrode, and includes:

a ceiling portion extending on the substrate processing space, providing a plurality of gas holes, and configuring a shower head together with the upper electrode; and a sidewall portion extending in a peripheral direction to surround the substrate processing space, wherein the sidewall portion provides a plurality of through-holes that each has an opening area that increases continuously or increases intermittently with plateaus along a direction from a lower end of the sidewall portion toward an upper end thereof, wherein the opening area of the through-holes is in general alignment along the direction from a lower end of the sidewall portion toward an upper end thereof, and wherein each of the plurality of through-holes provided closer to the upper end has a maximum width that is larger than a maximum width of any through-hole provided closer to the lower end.

11. The inner chamber according to claim 10, wherein the sidewall portion includes an upper portion and a lower portion, and wherein an opening area of the upper portion is larger than an opening area of the lower portion.

12. The inner chamber according to claim 11, wherein the upper portion is a portion from a center between the upper end and the lower end to the upper end in the sidewall portion, and wherein the lower portion is a portion from the center to the lower end in the sidewall portion.

13. The inner chamber according to claim 11, wherein the plurality of through-holes have a circular or oval shape.

14. The inner chamber according to claim 13, wherein the plurality of through-holes includes a plurality of first through-holes provided in the upper portion and a plurality of second through holes provided in the lower portion, and wherein a maximum width of each of the plurality of first through-holes is larger than a maximum width of each of the plurality of second through-holes.

15. The inner chamber according to claim 13, wherein a density of the plurality of through-holes in the upper portion is higher than a density of the plurality of through-holes in the lower portion.

* * * * *